United States Patent

Sugino et al.

[11] Patent Number: 5,827,756
[45] Date of Patent: Oct. 27, 1998

[54] METHOD OF MANUFACTURING SEMICONDUCTOR DEVICE

[75] Inventors: Manabu Sugino, Yokosuka; Susumu Uchikoshi, Yokohama; Takatoshi Noguchi, Yokosuka, all of Japan

[73] Assignee: Nissan Motor Co., Ltd., Kanagawa-ken, Japan

[21] Appl. No.: 683,274

[22] Filed: Jul. 18, 1996

[30] Foreign Application Priority Data

Jul. 25, 1995 [JP] Japan .................................. 7-189425

[51] Int. Cl.[6] .................................................... H01L 21/00
[52] U.S. Cl. ............................... 438/50; 438/48; 438/53; 438/977
[58] Field of Search ............................ 437/51, 228, 901, 437/974, 927, 7; 148/DIG. 159

[56] References Cited

U.S. PATENT DOCUMENTS

| | | | |
|---|---|---|---|
| 4,706,374 | 11/1987 | Murakami | 437/921 |
| 5,110,373 | 5/1992 | Mauger | 437/974 |
| 5,324,688 | 6/1994 | Kondo | 437/901 |
| 5,484,073 | 1/1996 | Erickson | 437/901 |
| 5,549,785 | 8/1996 | Sakai et al. | 148/DIG. 159 |

FOREIGN PATENT DOCUMENTS 0076483  4/1988  Japan ...................................... 437/901

OTHER PUBLICATIONS

"Sweep Rate Dependence of I–V Characteristics in Electrochemical Silicon Etch–Stop," by Ayahito Horinouchi et al., *Technical Digest*, 1990. pp. 19–22.

*Primary Examiner*—Tuan H. Nguyen
*Attorney, Agent, or Firm*—Lowe, Price, LeBlanc & Becker

[57] ABSTRACT

A method of manufacturing a semiconductor device by which an element region for electronic circuits or the like is formed on the surface of a semiconductor substrate, a diaphragm region is formed in the bottom surface of the semiconductor substrate, and a plurality of openings having different areas and shapes are formed in the semiconductor substrate. The method includes a step of forming a first diaphragm region in the bottom surface of a semiconductor substrate, a step of partially forming a second diaphragm region in the first diaphragm region, the second diaphragm region being thinner than the first diaphragm region, and a step of forming an opening by removing part or the whole of the second diaphragm region.

24 Claims, 9 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device by which a diaphragm region is formed in a bottom surface layer of a substrate by a recess forming process performed on the substrate bottom side and an opening is partially formed in the diaphragm region, and to a method of manufacturing a semiconductor device by which a plurality of recesses or openings is formed in a semiconductor substrate, more particularly to a method of manufacturing a semiconductor device such as a pressure sensor and an acceleration sensor.

2. Description of the Related Art

Figure 1A:
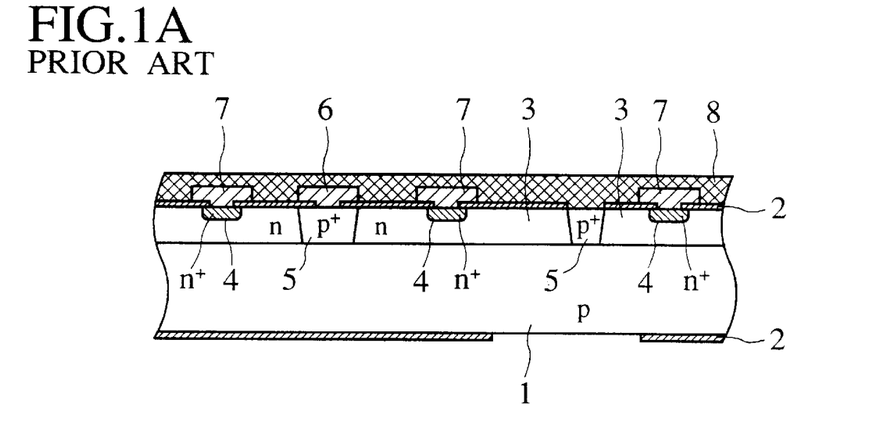
FIGS. 1A to 1C are schematic diagrams illustrating a conventional process flow for manufacturing a semiconductor device.
Figure 1B:
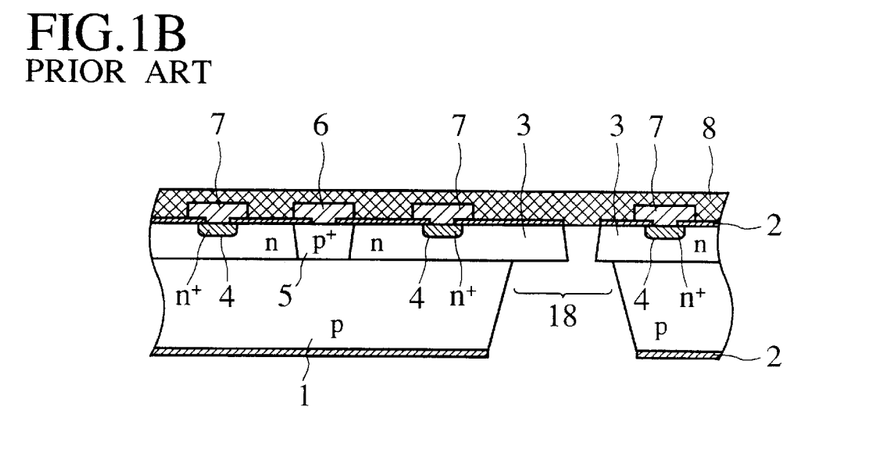
Figure 1C:
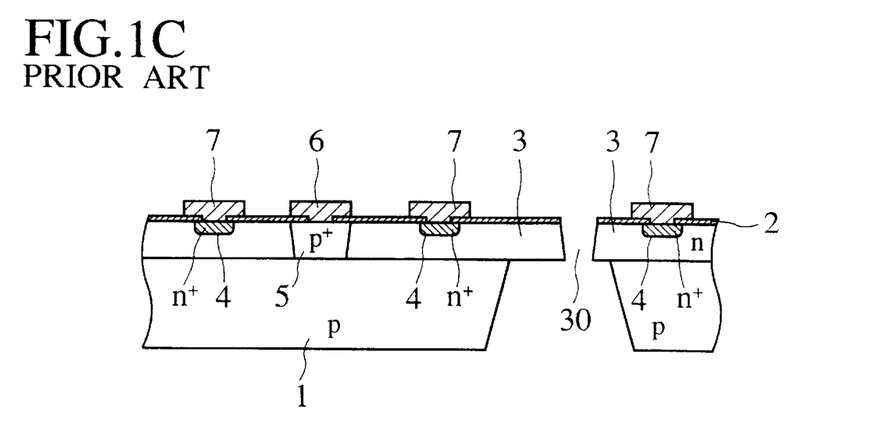

As a conventional method of manufacturing a semiconductor device such as a pressure sensor and an acceleration sensor, a method of forming a recess or diaphragm region by electrolytic etching is known, which uses a process flow, for example, such as shown in FIGS. 1A to 1C (refer to the paper of Horinouch and et al., Technical Digest of The 9th Sensor Symposium, (190), p. 19–22).

In FIG. 1A, reference numeral 1 represents a p-type semiconductor substrate, reference numeral 2 represents an oxide film, reference numeral 3 represents an n-type epitaxial layer formed on the semiconductor substrate, reference numeral 4 represents a high concentration n-type diffusion layer formed on the n-type epitaxial layer 3 at a predetermined area, reference numeral 5 represents a high concentration p-type region, reference numeral 6 represents a wiring layer for p-type regions, and reference numeral 7 represents a wiring layer for n-type regions. The n-type regions 3 and 4 are electrically connected by the wiring layer 7 for n-type regions, and the p-type regions 1 and 5 are electrically connected by the p-type wiring layer 6. The high concentration p-type region 5 is a high concentration p-type region (isolation region) for dividing the n-type epitaxial layer 3 into independent islands. The potential of the p-type semiconductor substrate 1 can be controlled by the p-type wiring layer 6. Reference numeral 8 represents an etching prevention mask layer formed on the substrate surface.

In order to form a recess in the bottom surface layer of the semiconductor substrate constructed as above and having in its top surface layer active layers such as n-and p-type regions, so-called stop etching is generally performed which utilizes a change in the etching characteristics of electrolytic etching at the interface between the p and n layers. Specifically, the electrolytic etching is performed by applying a positive voltage relative to the reference electrode immersed in alkaline etching solution to the n-type epitaxial layer 3 via the high concentration n-type diffusion layer 4 and wiring layer 7 for n-type regions. With this electrolytic etching, a desired diaphragm region 18 is formed from the bottom surface of the p-type semiconductor substrate toward the top surface (FIG. 1B) and an opening 30 is partially and selectively formed in the diaphragm region 18 (FIG. 1C).

The conventional method of manufacturing a semiconductor device illustrated in FIGS. 1A to 1C is, however, associated with a problem of destructing element regions such as electronic circuits formed on the top surface of the semiconductor substrate near at the opening 30. The reason for this is that when the opening 30 is partially formed in the diaphragm region 18, etchant of the electrolytic etching creeps toward the substrate top surface and enters between the substrate surface etching prevention mask layer 8 and the substrate surface oxide film 2.

Figure 2A:
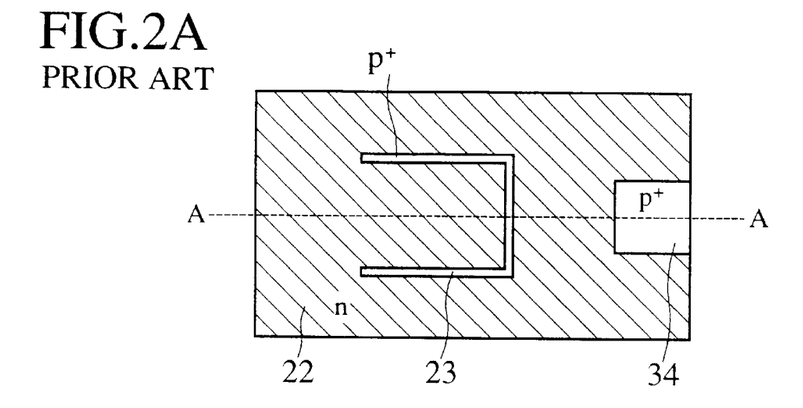
FIGS. 2A to 2D are schematic diagrams illustrating another conventional process flow for manufacturing a semiconductor device.
Figure 2B:
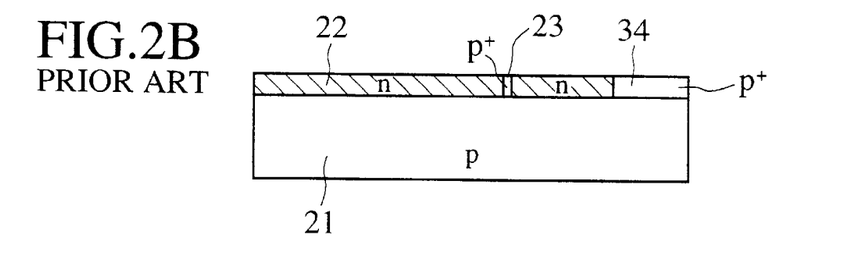
Figure 2C:
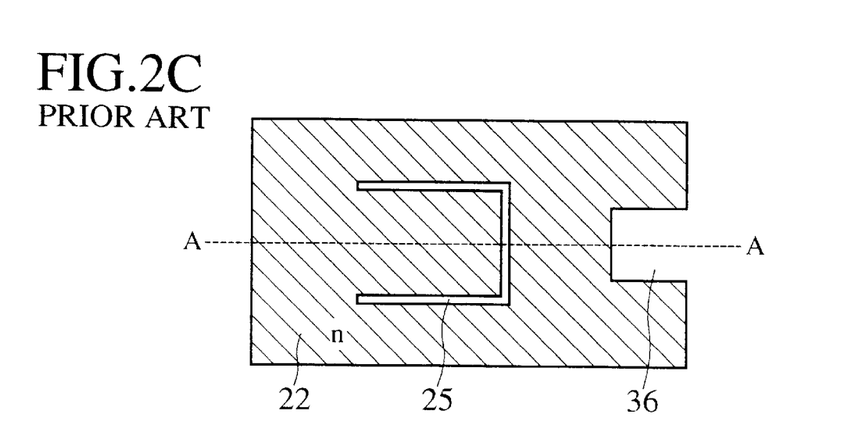
Figure 2D:
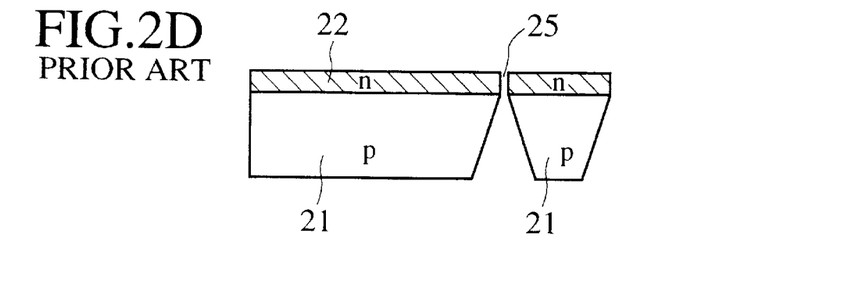

Another known conventional method of manufacturing a semiconductor device is illustrated in FIGS. 2A to 2D. FIG. 2B is a cross sectional view taken along line A—A in FIG. 2A, and FIG. 2D is a cross sectional view taken along line A—A in FIG. 2C. In FIGS. 2A and 2B, reference numeral 21 represents a p-type semiconductor substrate, and reference numeral 22 represents an n-type epitaxial layer. High concentration p-type diffusion layers 23 and 34 are p-regions formed on the n-type epitaxial layer 22 and designed to be finally opened, and are electrically connected to the p-type silicon substrate 21. Specifically, the high concentration p-type diffusion layers 23 and 34 are opened, for example, by electrolytic etching to be described hereinunder. FIGS. 2B and 2D are schematic cross sectional diagrams showing the shapes of the semiconductor substrate shown in FIGS. 2A and 2C, after electrolytic etching or other processes. The openings 25 and 36 correspond to the regions of the high concentration p-type diffusion layers 23 and 34 shown in FIGS. 2A and 2B removed by the electrolytic etching. Similar to the processes shown in FIGS. 1A to 1C, for the electrolytic etching or other processes, the whole top surface of the n-type epitaxial layer 22 including the p+ regions 23, 34 is covered with silicon resin or the like for the etching protection. Thereafter, the p-type silicon substrate 21 is immersed in alkaline solution and a predetermined voltage is applied to the n-type epitaxial layer 22 to electrolytically etch the substrate.

With the conventional semiconductor manufacturing method illustrated in FIGS. 2A to 2D, depending upon designs of electronic circuits or the like formed on the n-type epitaxial layer 22 or structural constraints of the semiconductor device, the shapes of a plurality of openings, or the shapes of high concentration p-type diffusion layers 23 and 34 are generally very different. For example, the high concentration p-type diffusion layer 23 of a slit shape (rectangle) having a width of about 30 $\mu$m and the high concentration p-type diffusion layer 34 generally of a solid having a square area of about 150×150 $\mu$m, are etched and removed to form openings. If it is necessary to form a plurality of openings having various areas and shapes, the state of convection (fluidity) of etchant becomes different at each region 23, 34 and the etching rate at each region 23, 34 is different. At the region 34 of 150×150 $\mu$gm, the etching rate is high and etchant moves fast so that an opening 36 is formed fast. After the opening is formed, etchant creeps from the opening 36 toward the adjacent substrate surface. This crept etchant continues to enter electronic circuits or the like formed near the opening 36 and damage them, until an opening is formed at the slit-like p-type high concentration diffusion layer 23 having a lower etching rate.

SUMMARY OF THE INVENTION

An object of the invention is to solve the problems associated with the conventional techniques and provide a method of manufacturing a semiconductor device by which an element region (active region) is formed on one principal surface (top surface) of a semiconductor substrate, and a diaphragm region is formed near the top surface at a bottom of a recess formed by an etching process performed from the other principal surface (bottom surface) of the substrate, the method being capable of preventing the element region on the substrate top surface from being destructed by etching solution penetrated between the etching prevention mask film and oxide film on the substrate surface side.

Another object of the invention is to provide a method of manufacturing a semiconductor device capable of adjusting an etching rate at each opening generally the same even if the areas and shapes of a plurality of openings are different, and preventing electronic circuits near at the openings from being corroded by crept etchant.

Figure 3A:
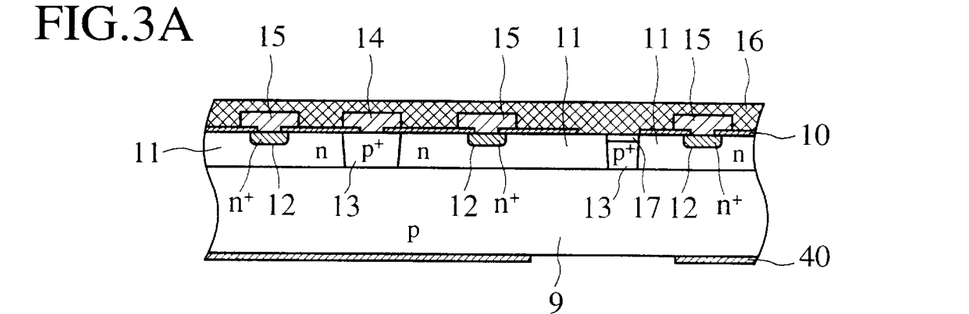
FIGS. 3A to 3H are schematic diagrams illustrating a process flow for manufacturing a semiconductor device according to a first embodiment of the invention.
Figure 3B:
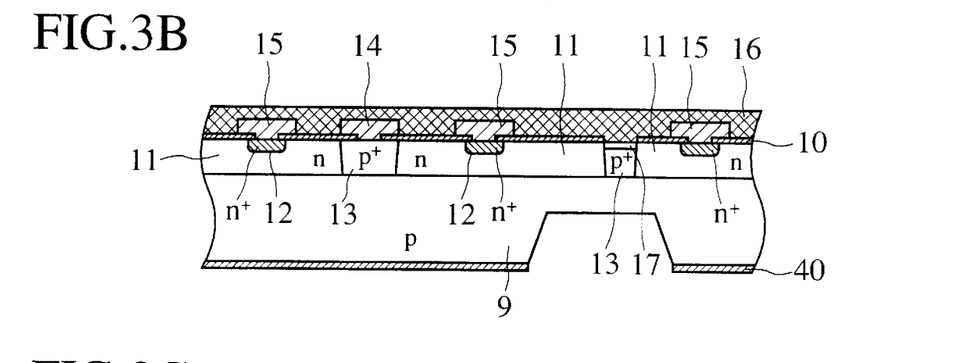
Figure 3C:
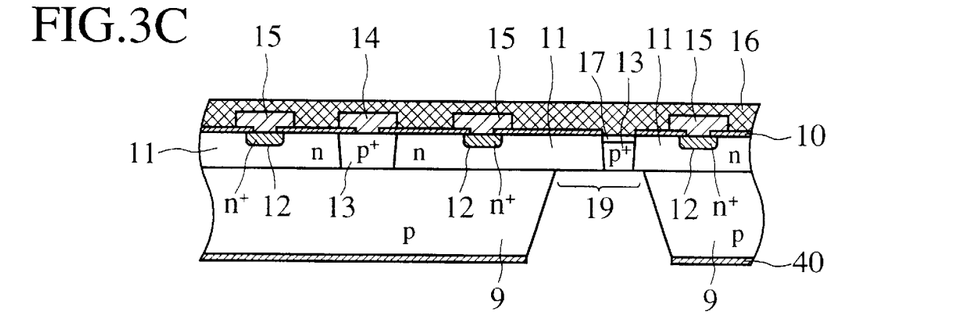
Figure 3D:
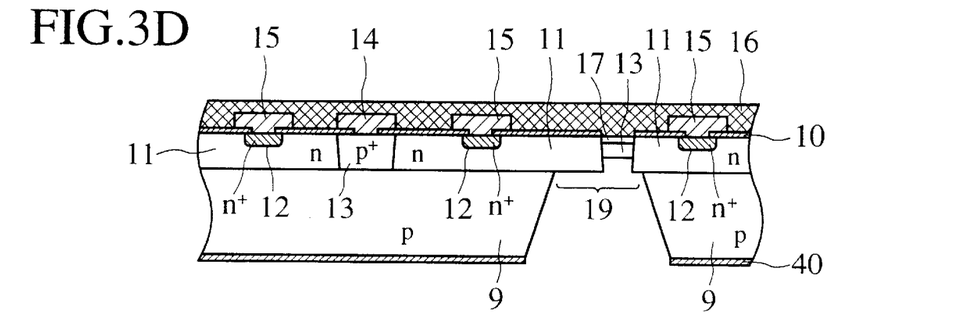
Figure 3E:
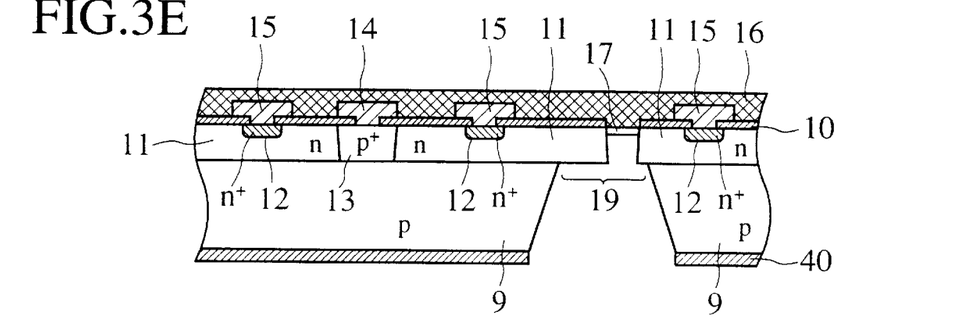
Figure 3F:
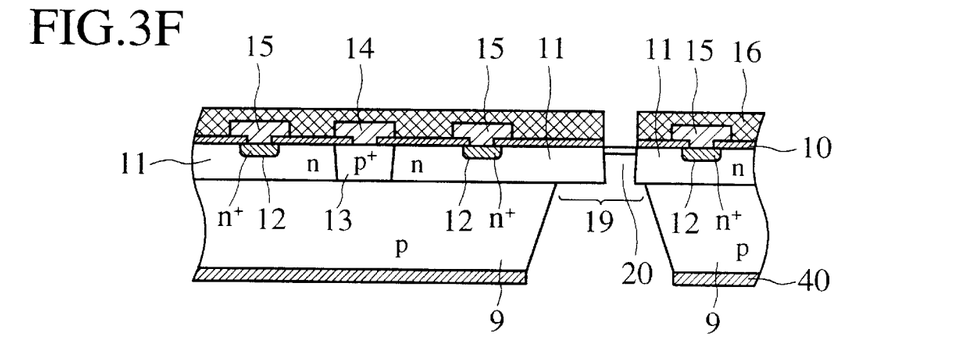
Figure 3G:
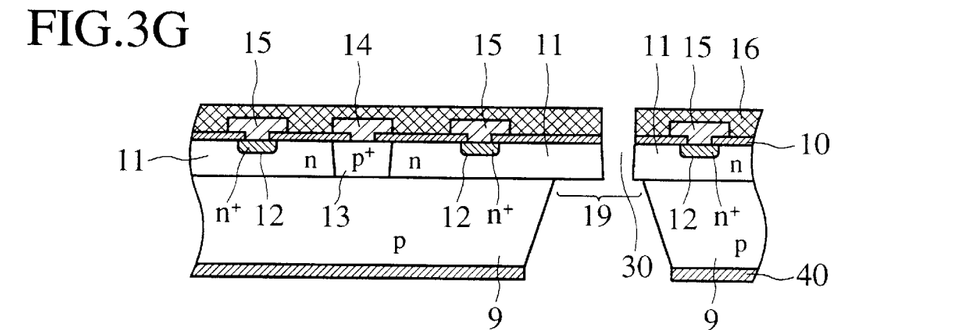
Figure 3H:
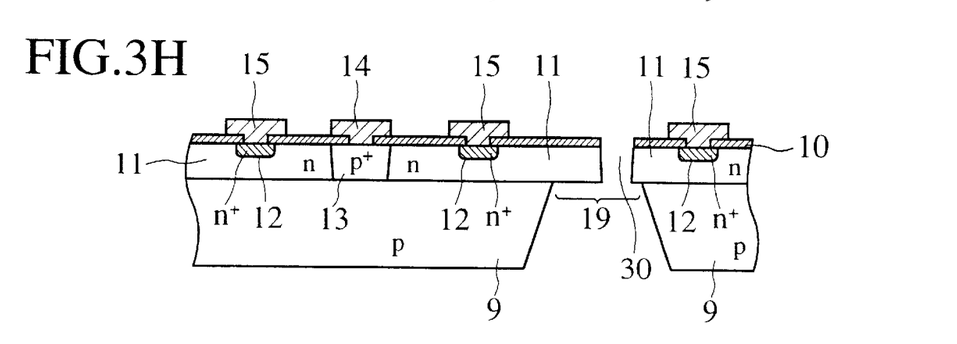

In order to achieve the above objects, as exampified in FIGS. 3A to 3H, the present invention provides as its first aspect a method of manufacturing a semiconductor device, comprising: a) a first step of forming an element region (11, 12, 13, 17) on a first principal surface (top surface) of a semiconductor substrate 9 (FIG. 3A); b) a second step of forming a first diaphragm region (19) by forming a first recess in a second principal surface (bottom surface) of the semiconductor substrate (FIGS. 3A, 3B, 3C); c) a third step of forming a second diaphragm region 20 by forming a second recess in the first recess, the second diaphragm region 20 being formed at the bottom of the second recess (FIG. 3D, 3E); and d) a fourth step of forming an opening 30 extending through the first principal surface to the second principal surface by removing part or the whole of the second diaphragm region 20 (FIGS. 3G, 3H). More specifically, the first step illustrated in FIG. 3A includes at least: a step of forming a first semiconductor region 11 of a second conductivity type on a semiconductor substrate 9 of a first conductivity type by epitaxial growth or the like; a step of selectively forming a second semiconductor region 13 of the first conductivity type in the first semiconductor region 11, by ion implantation or predeposition followed by thermal diffusion etc., the second semiconductor region 13 extending from the surface of the first semiconductor region to the surface of the first conductivity type semiconductor substrate 9; a step of forming a third semiconductor region 17 of the second conductivity type in the surface layer of the second semiconductor region 13, the third semiconductor region 17 having an impurity concentration higher than the first semiconductor region 11 and being in contact with the first semiconductor region at its periphery; a step of forming a first metal wiring layer 15 on the first semiconductor region 11, the first metal wiring layer being electrically connected to the first semiconductor region 11; and a step of forming a second wiring layer 14 on the second semiconductor region 13, the second wiring layer being electrically connected to the second semiconductor region 13. The first conductivity type is, for example, a p-type and the second conductivity type is an n-type opposite to the first conductivity type. The p- and n-type may be interchanged. The first semiconductor region is served as an active region for forming circuit elements such as transistors. A fourth semiconductor region 12 of the first conductivity type having a high impurity concentration may be optionally formed in the surface layer of the active region. Depending upon design of desired electronic circuits, fifth, sixth, seventh, . . . semiconductor regions may be optionally formed to form various integrated circuits. Obviously, over the first semiconductor region, a field oxide film, gate oxide film, interlayer insulating film, and other films are formed.

The second step of the first aspect of the invention includes, as illustrated in FIGS. 3A, 3B, and 3C: a step of forming a substrate surface etching prevention film 16 as a first etching mask on the whole surface over the first to third semiconductor regions and the first and second wiring layers; a step of selectively forming an oxide film 40 as a second etching mask on the second principal surface (bottom surface) of the semiconductor substrate 9; and a step of electrolytically etching the semiconductor substrate 9 by applying a bias to the first and third semiconductor regions 11 and 17 via the first wiring layer 15. This electrolytic etching is a so-called stop etching wherein as the etching proceeds and the first semiconductor region 11 of the second conductivity type is exposed, the etching is automatically stopped at the interface between the first semiconductor region 11 and the first conductivity type semiconductor substrate 9.

Similar to the second step, the third step electrolytically etches the second semiconductor region 13 of the first conductivity type by applying a bias to the first and third semiconductor regions 11 and 17 via the first wiring layer 15 (FIG. 3D), and automatically stops the electrolytic etching at the interface between the second semiconductor region 13 of the first conductivity type and the third semiconductor region 17 of the second conductivity type as shown in FIG. 3E. Since an opening is not still formed at this time, the etching solution will not creep toward the top surface of the active region 11 and the electronic circuits formed in the active region (first semiconductor region) 11 will not be damaged.

The fourth step of the first aspect of the invention includes, as illustrated in FIGS. 3F and 3G: a step of selectively removing the first etching mask only at a region on the third semiconductor region (FIG. 3F); and a step of removing part or the whole of the third semiconductor region by a mechanical means, dry etching, or wet etching. The mechanical means implies a breakage by applied pressure or the like, and the dry etching implies a plasma process, ion process and a photo-excited process using ultraviolet rays.

As above, according to the first aspect of the invention, the second and third steps form the first and second diaphragm regions 19 and 20, and the fourth step forms the opening 30. The etching solution such as alkaline solution used for electrolytic etching will not creep toward the top surface of the semiconductor chip so that the etching solution does not penetrate between the oxide film 10 formed on the first semiconductor region and the etching prevention film 16 formed on the oxide film 10. Accordingly, the substrate surface element region 11 formed with electronic circuits or the like is not destructed and a semiconductor device of high quality can be manufactured with high yield. According to the first aspect of the invention, semiconductor devices of high reliability can be achieved. If dry etching is used at the fourth step, the manufacture yield can be prevented from being lowered by generation of foreign undesired substances, as compared to the mechanical means, and semiconductor devices of high reliability can be achieved effectively. Namely, in the first aspect of the invention, if the second diaphragm region is removed by dry etching, foreign substances or alien particles likely to be generated by mechanical means when removing the thin diaphragm region can be suppressed, further improving the manufacture yield of semiconductor elements having a plurality of recesses and openings such as a pressure sensor and an acceleration sensor.

The present invention provides as its second aspect a method of manufacturing a semiconductor device, comprising, as examplified in FIGS. 5A to 5F and 6A to 6F: a) a first step of forming an element region (active region) on a first principal surface of a semiconductor substrate 21 (FIGS. 5A, 5B, 6A, 6B); b) a second step of forming a first opening 25 and a second opening 26 having the same pattern width by forming recesses extending from a second principal surface to the first principal surface of the semiconductor substrate 21 (FIGS. 5C, 5D, 6C, 6D); and c) a third step of forming a third opening 36 enlarging the second opening 26, the third opening 36 having different shapes and areas from that of the first opening 25 by processing and removing regions adjacent to the first openings 11.

Figure 5A:
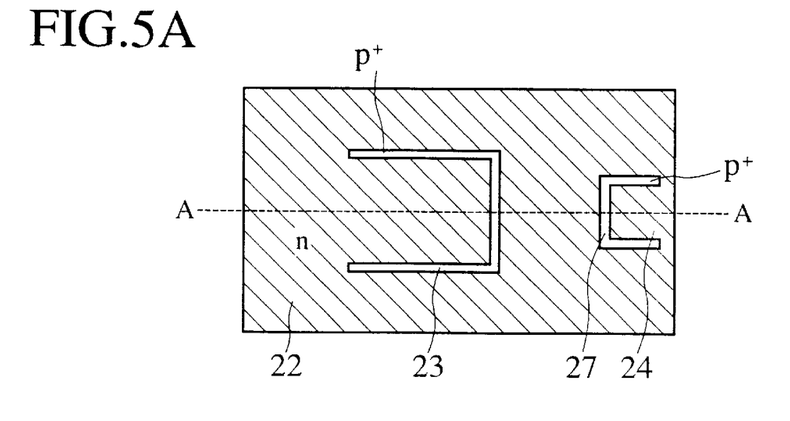
FIGS. 5A to 5F are schematic diagrams illustrating a process flow for manufacturing a semiconductor device according to a third first embodiment of the invention.

As illustrated in FIGS. 5C, 5D, 6C, and 6D, the second step of the second aspect of the invention is a step of forming slit-shaped preliminary openings (second opening) 26 having the predetermined pattern width at regions corresponding to the parts of sides of polygons inscribed to the third openings 36 as the final openings, and the third step is a step of removing the remaining parts of the polygonal sides unopened by the second step and forming the final openings (third openings) 36. The predetermined pattern width of the second opening 26 is designed to be same with that of the first opening 25. Therefore, the first step forms semiconductor regions 23 and 27 of the second conductivity type having the same pattern width in the first conductivity type semiconductor region 22 as shown in FIG. 5A. According to the manufacture method of the second aspect of the invention, even for a semiconductor device having a plurality of openings with various shapes in a finally assembled semiconductor chip, the plurality of openings can be formed by preparatory rectangular patterns with the same width. For example, by making the slit widths of the preliminary opening (second opening) generally the same as that of the first opening, the etching rate when the first and second openings on a semiconductor chip are formed can be controlled to be generally the same. The plurality of openings are therefore formed generally at the same time so that the electronic circuits on the semiconductor chip near at the openings can be suppressed from being corroded by creep of etchant. Hence, even if the desired areas and shapes of the final first and third openings are different, semiconductor devices of high quality can be effectively manufactured with high yield.

The third step of the second aspect of the invention is featured in that the remaining parts of the sides of the polygonal regions inscribed to the final opening (third opening) are designed to be positioned on the scribing lane or dicing area. Specifically, with the third step, the remaining parts of the polygonal sides are removed to form the final openings at the same time when the semiconductor substrate is diced into each chip for the assembly. The remaining parts may be removed by the mechanical means. Alternatively, removing the remaining parts of the sides and forming the final opening (third opening) by the third step may be performed by dry or wet etching such as a plasma process or a photo-excited process.

The third aspect of the present invention includes, as exemplified in FIGS. 4A to 4D, 5A to 5E, and 6A to 6F: a step of forming a first semiconductor region 22 of a second conductivity type on a semiconductor substrate 21 of a first conductivity type; a step of forming striped patterns of second semiconductor regions 23 and 27 of the first conductivity type in the first semiconductor region 22, the second semiconductor regions extending from the surface of the first semiconductor region 22 to the surface of semiconductor substrate 21 in the form of a first and a second patterns having the identical pattern width (FIGS. 4A, 4B, 5A, 5B, 6A, 6B); and a step of forming a first and a second openings 25 and 26 corresponding to the first and second patterns, respectively, by selectively removing the second semiconductor regions 23 and 27 and part of the first conductivity type semiconductor substrate 21 by electrolytic etching (FIGS. 4C, 4D, 5C, 5D, 6C, 6D).

Figure 4A:
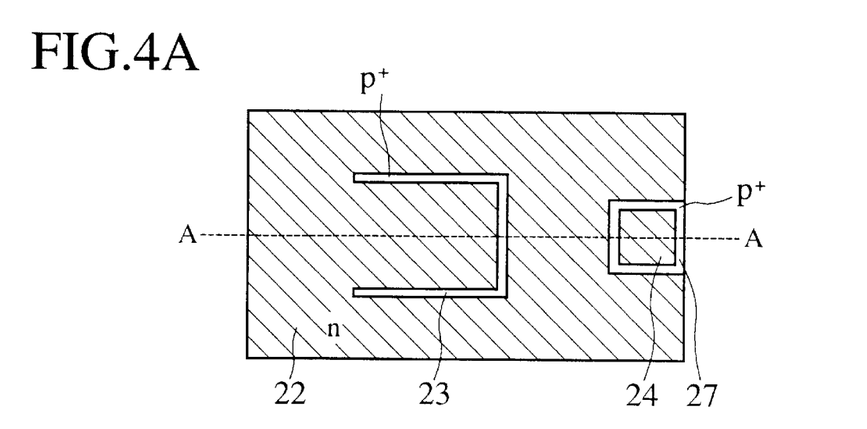
FIGS. 4A to 4D are schematic diagrams illustrating a process flow for manufacturing a semiconductor device according to a second first embodiment of the invention.

As shown in FIG. 4A, the slit pattern of the second semiconductor region 27 is formed on all the sides of a polygon (rectangle) ascribed to the final opening (third opening) 36. Therefore, the second semiconductor regions 23 and 27 at the regions surrounded by the inscribed polygonal sides are etched and removed to form the final large area opening 36. Alternatively, as shown in FIGS. 5C, 5D, 6C, and 6D, a pattern of the second semiconductor region has at least one unetched side of the inscribed polygonal sides. Therefore, after the remaining portion at the unetched polygonal side, i.e., the portion of the first semiconductor region 22 adjacent to the desired final opening 36, is removed to form the final large area opening 36 as shown in FIGS. 5E, 5F, 6E, and 6F.

According to the manufacture method of the third aspect of the invention, even for a semiconductor device having a plurality of openings 25, 36,. . . having different shapes and areas in a finally assembled semiconductor chip, the plurality of openings 25, 26, . . . can be formed by preparatory slits with the same pattern width. The pattern width of inscribed polygonal slits 26 to the final opening 36 is identical with that of another slit 25 having different pattern. For example, by making the slit widths generally the same, the etching rate can be controlled to be generally the same. The plurality of openings are therefore formed approximately at the same time so that the electronic circuits on the semiconductor chip near at the openings can be suppressed from being corroded by creep of etchant. Therefore, semiconductor devices of high quality can be effectively manufactured with high yield.

Other and further objects and features of the present invention will become obvious upon an understanding of the illustrative embodiments about to be described in connection with the accompanying drawings or will be indicated in the appended claims, and various advantages not referred to therein will occur to one skilled in the art upon employing of the invention in practice.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

1st Embodiment

FIGS. 3A to 3H are schematic diagrams illustratively showing manufacture processes of a semiconductor device according to the first embodiment of the invention. In FIG. 3A, reference numeral 9 represents a p-type silicon substrate, reference numeral 11 represents an n-type epitaxial layer (first semiconductor region) formed on the p-type silicon substrate, and reference numeral 12 represents a high concentration n-type diffusion layer (n+layer) formed on the n-type epitaxial layer 11 at its predetermined area. Reference numeral 10 represents a field oxide film formed on the n-type epitaxial layer 11, and reference numeral 40 represents an oxide film as an etching mask formed on the bottom surface of the p-type silicon substrate 9. The high concentration n-type diffusion layer 12 is electrically connected to a metal wiring layer (first metal wiring layer) 15 for n-type regions via a contact hole formed in the field oxide film 10. Reference numeral 13 represents a high concentration p-type region (p+ region or second semiconductor region) as an isolation region for dividing the n-type epitaxial layer 11 into independent islands. The potential of the p-type silicon substrate 9 can be controlled by a metal wiring layer (second metal wiring layer) 14 formed on p+ region 13. Reference numeral 16 represents a substrate surface etching prevention film (first etching mask), and reference numeral 17 represents a high impurity concentration n-type diffusion layer (n+ layer or third semiconductor region) partially formed at a region where an opening is designed to be formed, the n+ layer 17 having a diffusion depth shallower than the p-type isolation region 13.

The method of manufacturing a semiconductor device according to the first embodiment of the invention first forms a diaphragm region by electrolytic etching and then partially forms an opening in the diaphragm region, in accordance with the process flow illustrated in FIGS. 3A to 3H. The electrolytic etching of this invention is a so-called stop etching method which utilizes a change in the etching characteristics at the interface between the p and n layers. Specifically:

(a) On the first principal surface (top surface) of the p-type semiconductor substrate 9 with the n-type epitaxial layer 11, a desired electronic circuit element region is formed as shown in FIG. 3A (first process).

The first process includes: a process of forming the n-type first semiconductor region 11 by epitaxial growth or the like; a process of selectively forming the p-type second semiconductor region 13 from the surface of the first semiconductor region 11 to the p-type semiconductor substrate 9 by using ion implantation or vapor phase diffusion (predeposition); a process of selectively forming the n-type third semiconductor region 17 near in the surface layer of the second semiconductor region 13 by ion implantation or vapor phase diffusion, the third semiconductor region 17 having an impurity concentration higher than the first semiconductor region 11 and its periphery contacting the first semiconductor region 11; a process of forming the insulating film 10 such as a field oxide film 10 on the first semiconductor region 11, and forming the first metal wiring layer 15 electrically connected to the first semiconductor region 11 via a contact hole formed in the insulating film 10; a process of forming the second metal wiring layer 14 on the second semiconductor region 13, the second metal wiring layer 14 being electrically connected to the second semiconductor region 13 via a contact hole formed in the insulating film 10; and other processes. Selective formation of the second and third semiconductor regions 13 and 17 and the like may use well-known photolithography techniques such as an optical lithography or an electron beam (EB) lithography. Formation of the first and second metal wiring layers 12 and 15 may use so-called metalization techniques which deposit metal such as Al, Al—Si, Ti, and Mo by EB evaporation or sputtering and pattern the deposited metal by photolithography techniques.

(b) Next, as shown in FIG. 3A, the substrate surface etching prevention film 16 as a first etching mask is formed on the whole surface over the first to third semiconductor regions 11, 12, 13, and 17 and the first and second metal wiring layers 14 and 15, the oxide film 40 as the second etching mask is selectively formed on the second principal surface (bottom surface) of the semiconductor substrate 9 at a predetermined region, and thereafter, the semiconductor substrate 9 is electrolytically etched while a bias is applied to the first and third semiconductor regions 11 and 13 via the first metal wiring layer 15 (second process).

Specifically, in this second process, a first recess is formed in the second principal surface layer of the semiconductor substrate 9 as shown in FIG. 3B by applying a positive bias relative to the reference electrode immersed in alkaline etching solution to the n-type epitaxial layer 11 via the high concentration n-type diffusion layer 12 and metal wiring layer 15 for n-type regions. In this case, the etching proceeds because the bias is not applied to the p-type silicon substrate 9. As the etching further proceeds and when the n-type epitaxial layer 11 applied with the bias exposes, the etching stops at the exposed n-type epitaxial layer 11 as shown in FIG. 3C. This exposed region is the first diaphragm region 19.

(c) However, since the p-type isolation region (high concentration p-type region or p+ region) 13 is not applied with the bias, etching further proceeds at this p-type isolation region 13 as shown in FIG. 3D. Namely, after the second process, the third process of proceeding the etching is performed. In the third process, as shown in FIG. 3E, a second recess is formed at the bottom of the first recess, and when the high concentration n-type diffusion layer 17 having a high impurity concentration is exposed at the bottom of the second recess, the etching stops. This exposed diffusion layer 17 becomes the second diaphragm region 20 shown in FIG. 3F. Since an opening is not still formed when the high concentration n-type diffusion layer 17 exposes, the etching solution will not creep toward the substrate surface so that a predetermined diaphragm shape can be reliably formed.

(d) After the above electrolytic etching is performed, part or all of the substrate surface etching prevention film 16 at the second diaphragm region 20 at which an opening is formed, is removed. Thereafter, resist or the like is coated on the surface other than the surface at which the opening is formed, by photolithography, and the substrate surface etching prevention film 16 at the second diaphragm region 20 at which the opening is formed, is selectively removed as shown in FIG. 3F. Thereafter, part or all of the exposed second diaphragm region 20 is removed by mechanical means such as applied pressure to form a diaphragm opening 30 as shown in FIG. 3G. These processes correspond to the fourth step. Thereafter, the substrate surface etching prevention film 16 is removed to complete the semiconductor device shown in FIG. 3H of the first embodiment of the invention.

According to the manufacture method of the first embodiment of this invention, etching solution will not creep between the substrate surface etching prevention film 16 and the substrate surface oxide film 10. Therefore, the element region on the substrate surface will not be destructed so that a desired diaphragm region can be formed and an opening is partially formed at the diaphragm region.

The fourth process of forming the opening by removing part or all of the exposed diaphragm 20 has been described in connection with FIGS. 3F to 3G. The fourth process of forming the opening may be performed by dry etching or wet etching. For the dry etching, the ion process such as ion milling or the plasma process such as RIE (Reactive Ion Etching) and ECR (Electron Cyclotron Resonance) may be used by using the substrate surface etching prevention film as a mask and using as etching gas $CF_4$, $CHC_3$, $SiCl_4/Cl_2$, $BCl_3/Cl_2+N_2+Al$, $SF_6$, or $CF_4$. Alternatively, a photo-excited process may be used if the damages by plasma excessive energy raise some practical problems for the electronic circuits. For the etching by a photo-excited process (photo-excited etching), gas such as $HBr/Cl_2/O_2$, HCl, or $BCl_3$ may be used and a light source such as excimer laser beam at ArF (193 nm), KrF (249 nm), or XeCl (308 nm), high pressure mercury lamp, or mercury xenon lamp may be used. That is, the etching is performed by using energy of excited light irradiated from these light sources. The wet etching may be performed in a more simple manner by desired Si etching solution such as hydrofluoric acid, nitric acid, acetic acid solution. For the wet etching, a process of covering the bottom surface of the substrate with resist or the like may be added if necessary.

If the opening is formed by breaking the thin diaphragm by mechanical pressure, manufacture yield may be lowered by foreign substances or alien particles generated during breaking. Generation of foreign substances or fragments of semiconductor wafer can be suppressed almost completely by using dry etching or wet etching for removing the thin diaphragm region and so a diaphragm opening of high precision can be formed. Therefore, manufacture yield can be improved more than the mechanical means.

The method of manufacturing a semiconductor device according to the first embodiment of this invention has two process stages in which an element region is formed on the surface (top surface) of a semiconductor substrate, a recess forming process is performed from the bottom surface of the semiconductor substrate to form the first diaphragm region 19 in the surface layer of the semiconductor substrate, the second diaphragm region 20 thinner than the first diaphragm region 19 is formed prior to partially forming the opening at the first diaphragm region, and thereafter, part or all of the second diaphragm region is removed. With these two process stages of forming the first and second diaphragm regions, etching solution will not creep between the substrate surface etching prevention film 16 and the substrate surface oxide film 10 will not enter the region near the opening and destruct the element region. Therefore, semiconductor elements of high quality can be effectively manufactured with high yield.

2nd Embodiment

Figure 4B:
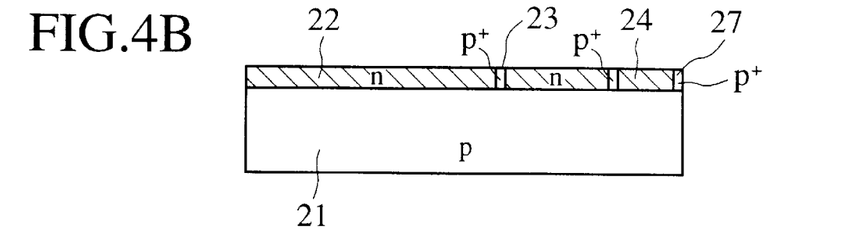
Figure 4C:
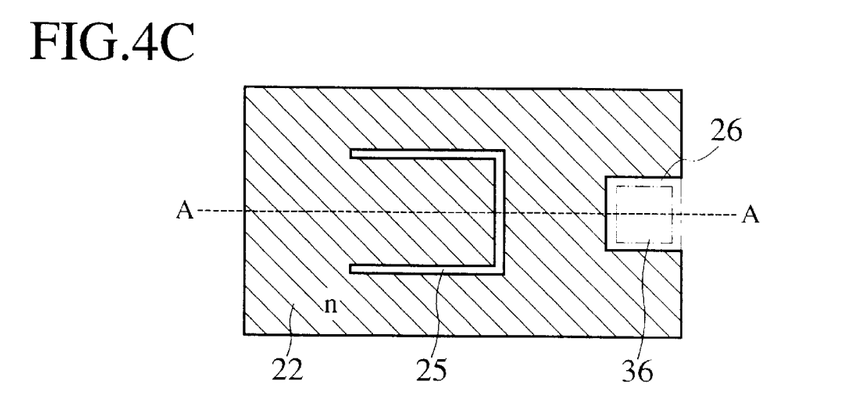
Figure 4D:
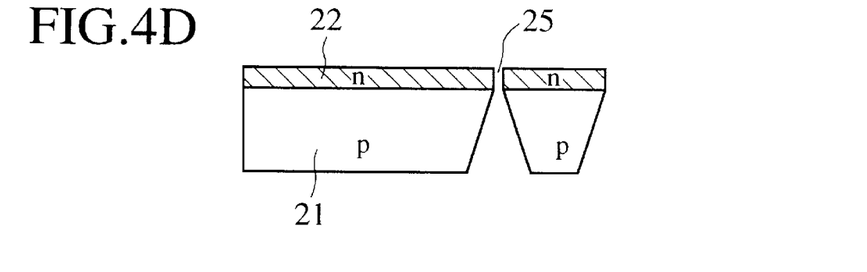

FIGS. 4A to 4D are schematic diagrams illustratively showing manufacture processes of a semiconductor device according to the second embodiment of the invention. In FIGS. 4A to 4D, reference numeral 21 represents a p-type silicon substrate of a first conductivity type, and reference numeral 22 represents an n-type epitaxial layer as a first semiconductor region of a second conductivity type formed on the p-type silicon substrate 21. Reference numeral 23 represents a high concentration p-type diffusion layer ($p^+$ layer) as a second semiconductor region formed in the n-type epitaxial layer 22, this $p^+$ layer 23 having a first pattern being electrically connected to the p-type silicon substrate 21. The region of the $p^+$ layer 23 is a planned region which eventually becomes a first opening by electrolytic etching or other processes, and is patterned in a desired shape on the p-type silicon substrate 21. Reference numeral 24 represents an n-type epitaxial layer which is designed to be eventually opened and removed. Reference numeral 27 represents a region having a second pattern which becomes sides of a rectangle inscribed to a final opening 36, this ring-shaped region 27 being formed surrounding the layer 24 to be opened and being a p-type high concentration diffusion layer ($p^+$ layer) having the same width as the first pattern of $p^+$ layer 23. The $p^+$ layer 27 formed surrounding the region 24 to be opened is also electrically connected to the p-type silicon substrate 21, and therefore can be removed by electrolytic etching or other processes. FIGS. 4C and 4D are schematic diagrams showing the shapes of the substrate shown in FIGS. 4A and 4B after the openings are formed by electrolytic etching or other processes. The opening (first opening) 25 positions at the region where the first pattern of $p^+$ layer 23 shown in FIGS. 4A and 4B is removed, and the final opening (third opening) 36 is essentially formed by removing the second pattern of the $p^+$ layer 27 surrounding the n-type epitaxial layer 24. The two dot-dashed line in FIG. 4C represents a virtual second opening 26 included in the third opening.

The method of manufacturing a semiconductor device such as shown in FIGS. 4A to 4D according to the second embodiment of the invention may be performed, for example, by the following processes.

(a) Similar to the first embodiment of the invention, on a p-type semiconductor substrate 21 an n-type semiconductor region 22 is formed by epitaxial growth or the like.

(b) Next, in the first semiconductor region 22, p-type second semiconductor regions 23 and 27 are selectively formed to have the same pattern width by ion implantation or vapor phase diffusion, the regions 23 and 27 extending from the surface of the first semiconductor region 22 to the p-type silicon substrate 21 as shown in FIGS. 4A and 4B. Selective formation of the second semiconductor regions 23 and 27 may use well known photolithography techniques. Depending upon design specification, metalization techniques may be performed if necessary which deposit metal such as Al, Al—Si, Ti, and Mo by EB evaporation or sputtering and pattern the deposited metal by photolithography techniques. The element region (active region) may be formed if necessary on the first principal surface (top surface) of the semiconductor substrate constituted by the p-type silicon substrate 21 and the n-type epitaxial layer 22.

(c) Next, similar to the first embodiment of the invention, electrolytic etching is performed after forming a protection film such as silicon resin (substrate surface etching protection film) on the whole first principal surface (top surface) of the semiconductor substrate constituted by the n-type epitaxial layer 22 and the p-type silicon substrate 21. Specifically, after the substrate surface etching prevention film is formed, the p-type silicon substrate 21 is immersed into alkaline solution and the etching is performed by applying a predetermined voltage or a bias current to the n-type epitaxial layer 22 to form openings 25 (, 26) and 36 such as shown in FIGS. 4C and 4D.

According to the second embodiment of the invention, the p-type high concentration diffusion layers 23 and 27 formed on the p-type silicon substrate 21 have a first and a second patterns of a slit shape having approximately the same width. Therefore, there is almost no difference of an etching rate at the regions where the openings 25 and 36 are formed although they have final different areas. Accordingly, the openings 25 and 36 are formed approximately at the same time so that etchant will not creep toward the surface of the p-type silicon substrate 21 near at the openings. All the openings can be formed without deteriorating the electronic circuits near at the openings, improving manufacture yield.

3rd Embodiment

Figure 5B:
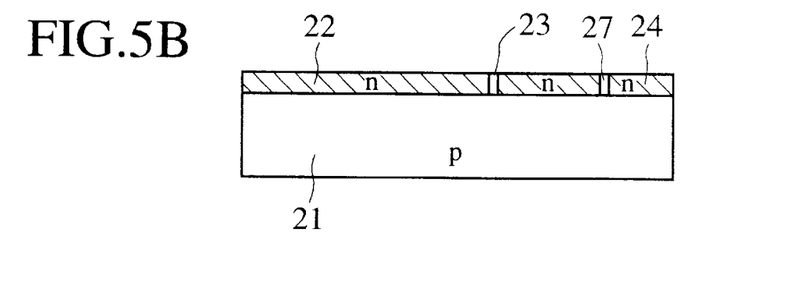
Figure 5C:
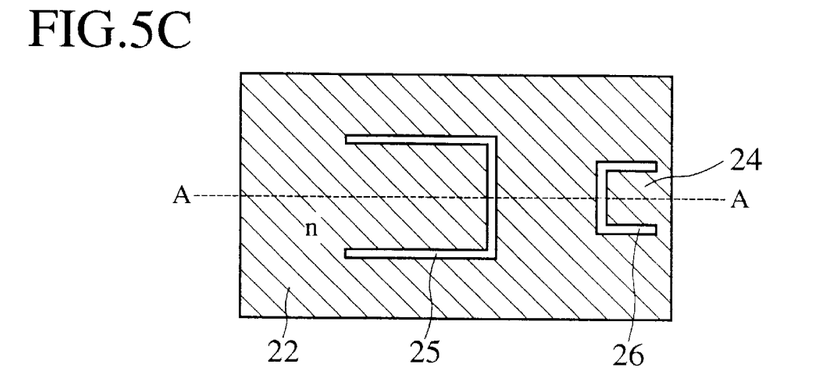
Figure 5D:
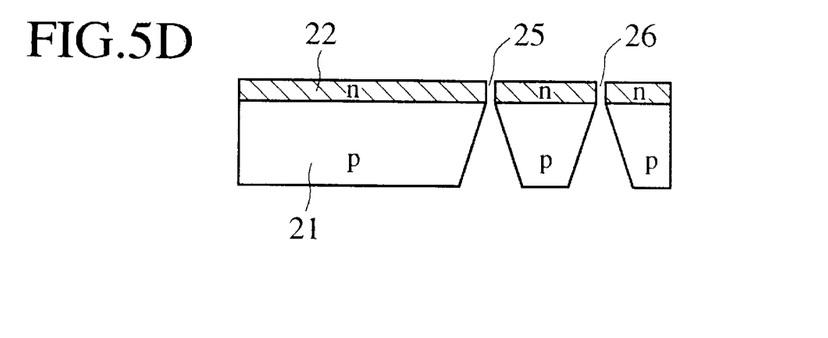
Figure 5E:
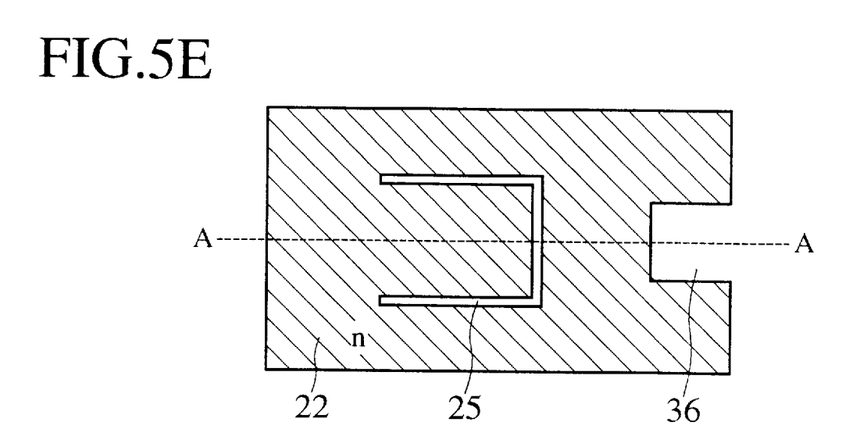
Figure 5F:
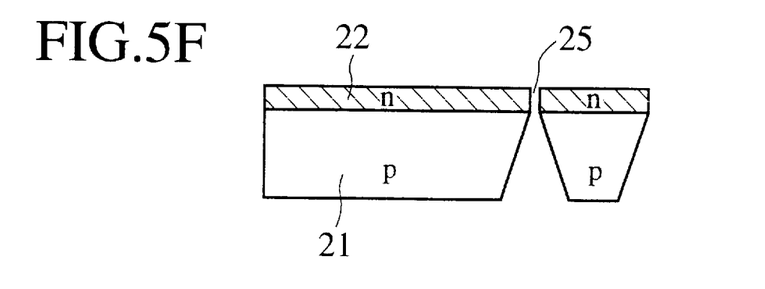

FIGS. 5A to 5F are schematic diagrams illustratively showing manufacture processes of a semiconductor device according to the third embodiment of the invention. FIGS. 5B, 5D, and 5F are schematic diagrams showing the cross sectional structures of the semiconductor substrate taken along lines A—A of FIGS. 5A, 5C, and 5E. In FIGS. 5A to 5F, reference numeral 21 represents a p-type silicon substrate, reference numeral 22 represents an n-type epitaxial layer formed on the p-type silicon substrate 21, reference numeral 23 represents a high concentration p-type diffusion layer ($p^+$ layer) as a second semiconductor region formed in the n-type epitaxial layer 22, this layer 23 being electrically connected to the p-type silicon substrate 21. The region of the $p^+$ layer having a first pattern 23 is a planned region which eventually becomes an opening by electrolytic etching or other processes, and is patterned in a desired shape on the p-type silicon substrate 21. Reference numeral 24 represents an n-type epitaxial layer which is designed to be eventually opened and removed and becomes an opening 36. Reference numeral represents a p-type high concentration diffusion layer ($p^+$ layer) as another second semiconductor region formed surrounding the n-type epitaxial layer 24 to be opened or vanished, this layer 27 having generally the same width as that of the first pattern of the $p^+$ layer 23. The second pattern of the $p^+$ layer 27 formed surrounding the region 24 to be opened is also electrically connected to the p-type silicon substrate 21, and therefore can be removed by electrolytic etching or other processes. The $p^+$ layer 27 is not formed at one side of the rectangle region 24 to be opened, and does not constitute a closed rectangle as shown in FIG. 5C. FIGS. 5C and 5D are schematic diagrams showing the structure of the semiconductor device shown in FIGS. 5A and 5B after the electrolytic etching or other processes are performed. Reference numerals 25 and 26 represent a first and a second openings formed by the electrolytic etching or other processes. FIGS. 5E and 5F are schematic diagrams of the semiconductor device wherein the silicon piece 24 of the n-type epitaxial layer left in a region (third opening) 36 is removed and opened by external mechanical force. For a method of removing the silicon piece 24 of the n-type epitaxial layer left at the region 36 to be finally opened by external mechanical force, for example, a tape is adhered to the silicon piece 24 and peeled off to remove the silicon piece 24.

According to the third embodiment of the invention, a semi-closed $p^+$ polygonal region (rectangle region) 27 inscribed to the large area region 36 to be finally opened is used. Each side 27 of the inscribed polygonal region (second pattern) has the same width as first patterns 23. By opening the sides of the inscribed polygonal region, i.e., the peripheral area of the large area region to be finally opened, the third opening having a large area is finally formed. In this case, one side of the inscribed polygonal region, i.e., part of the peripheral area, is not etched so that the silicon piece 24 of the n-type epitaxial layer is left unetched in the region 36 to be finally opened and is held by one side of the inscribed polygonal region. Accordingly, although there is a fear in the second embodiment that the portion corresponding to the silicon piece 24 flows into the etchant and may damage other patterns, in the third embodiment the silicon piece 24 will not go adrift in the etchant as an alien particle so that damages of the semiconductor device to be caused by a mixture of foreign substances with the etchant can be reduced.

4th Embodiment

Figure 6A:
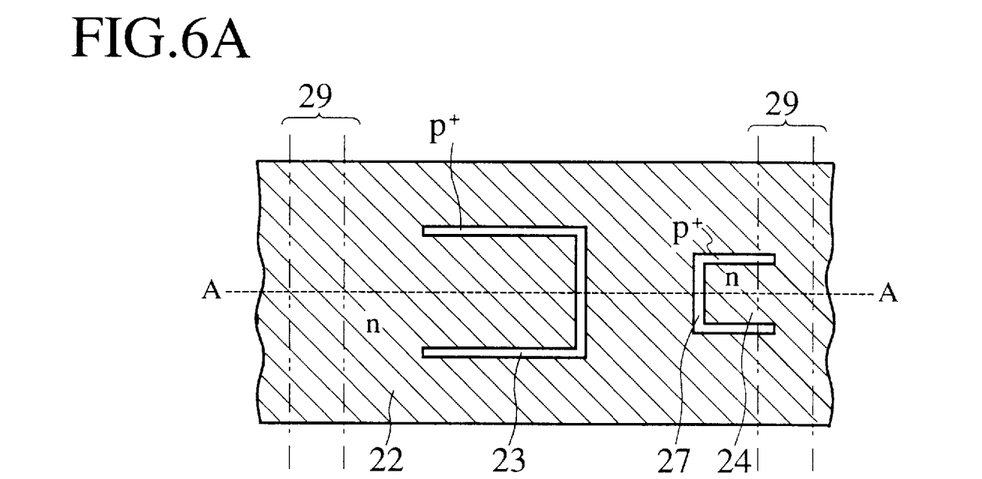
FIGS. 6A to 6F are schematic diagrams illustrating a process flow for manufacturing a semiconductor device according to a fourth embodiment of the invention.
Figure 6B:
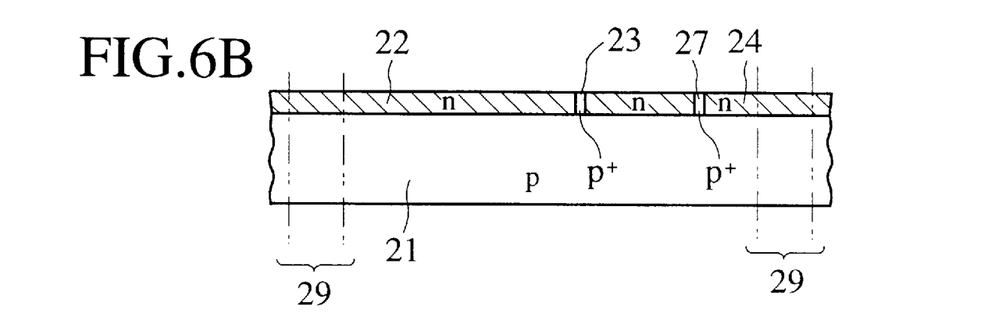
Figure 6C:
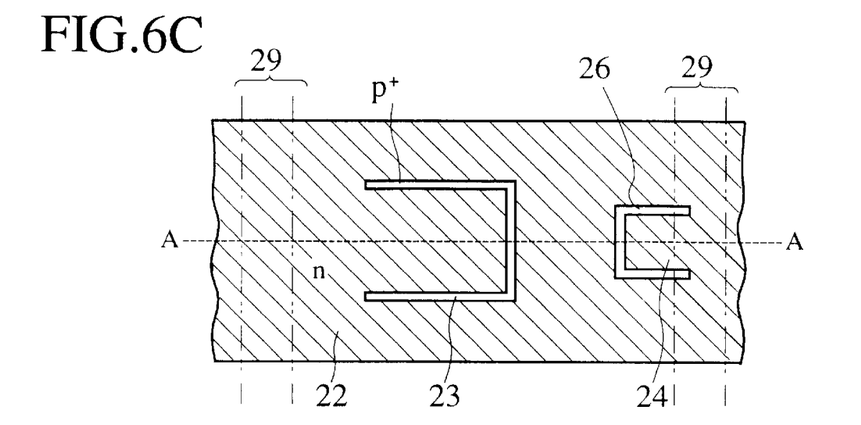
Figure 6D:
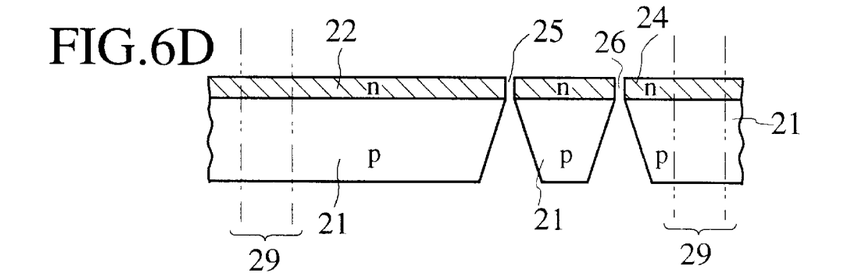
Figure 6E:
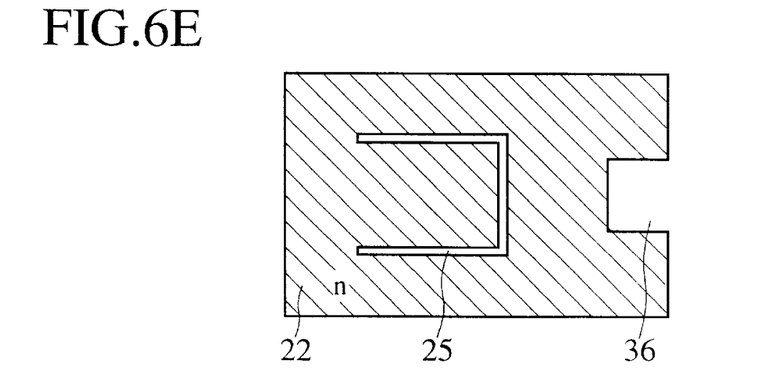
Figure 6F:
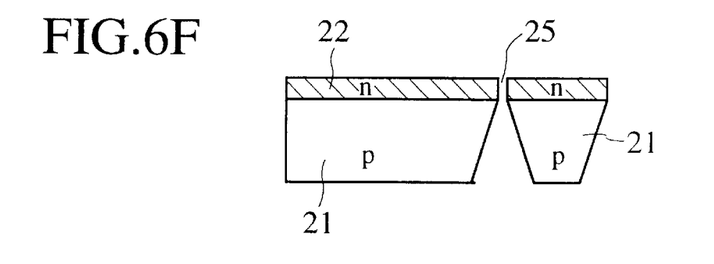

FIGS. 6A to 6F are schematic diagrams illustratively showing manufacture processes of a semiconductor device according to the fourth embodiment of the invention. FIGS. 6B, 6D, and 6F are schematic diagrams showing the cross sectional structures of the semiconductor substrate taken along lines A—A of FIGS. 6A, 6C, and 6E. In FIGS. 6A to 6F, reference numeral 21 represents a p-type silicon substrate, reference numeral 22 represents an n-type epitaxial layer formed on the p-type silicon substrate 21, reference numeral 23 represents a high concentration p-type diffusion layer ($p^+$ layer) formed in the n-type epitaxial layer 22, this $p^+$ layer 23 being electrically connected to the p-type silicon substrate 21. The region of the $p^+$ layer 23 is a planned region having a first pattern which eventually becomes a first opening by selective electrolytic etching or other processes, and is patterned in a desired shape on the p-type silicon substrate 21. Reference numeral 24 represents an n-type epitaxial layer which is designed to be eventually removed and opened. A p-type high concentration diffusion layer ($p^+$ layer) 27 is formed on the sides (peripheral area) of a polygonal (rectangular) region inscribed to a region (third opening) 36 to be finally opened, and has a belt-shaped pattern (second pattern) having the same width as the first pattern of the $p^+$ layer 23. The semi-closed $p^+$ layer 27 formed on the sides of the polygonal (rectangular) region inscribed to the region 36 to be finally opened, is also electrically connected to the p-type silicon substrate 21 so that it can be selectively opened by the electrolytic etching or other processes. The $p^+$ region 27 is not formed partially at the peripheral area of the n-type epitaxial layer 24 to be opened and does not constitute a closed inscribed polygonal region. Part of the second pattern of the $p^+$ region 27 is positioned on a dicing region (called "a scribing lane") 29 along which the p-type silicon substrate 21 is divided into each semiconductor chip. FIGS. 6C and 6D are schematic diagrams showing the structure of the semiconductor device shown in FIGS. 6A and 6B after the electrolytic etching or other processes are performed. Reference numerals 25 and 26 represent first and second openings formed by the electrolytic etching or other processes. Reference numeral 24 represents an n-type epitaxial layer left as a silicon piece whose three sides are removed. FIGS. 6E and 6F are schematic diagrams of the semiconductor device showing the first opening 25 and the third opening 36 after the silicon piece 24 of the n-type epitaxial layer is removed.

According to the fourth embodiment of the invention, three sides of the peripheral area of the n-type epitaxial layer 24 which finally becomes the third opening 36 are etched in the form of slit, and one of the four sides of the rectangle inscribed to the final opening 36 is left unetched by the electrolytic etching. The left unopened area is positioned on the scribing lane 29. The silicon piece left at the region of the final opening 36 is removed at the same time when the p-type semiconductor substrate 21 is divided into each semiconductor chip. Namely, without adding any particular process, the opening is formed at the same time when the assembly and mount processes are performed. The semiconductor substrate may be cut by an optical means such as laser scriber using $CO_2$ laser or YAG laser, or a mechanical means using outer blade diamond saw, inner blade diamond saw, wire saw, or diamond blade scriber utilizing cleavage.

Various modifications will become possible for those skilled in the art after receiving the teachings of the present disclosure without departing from the scope thereof.

What is claimed is:

1. A method of manufacturing a semiconductor device, comprising:
   a) a first step of forming an element region on a first principal surface of a semiconductor substrate, the element region having a portion consisting essentially of an upper layer acting as an etch stop layer and a lower layer which is in contact with the upper layer, the upper layer being thinner than the lower layer;
   b) a second step of forming a first diaphragm region by forming a first recess in a second principal surface of the semiconductor substrate;
   c) a third step of forming a second diaphragm region by forming a second recess at a portion of the bottom of the first recess by removing said lower layer and stopping the recess forming at a boundary between said upper and lower layer, the second diaphragm region being formed of said upper layer at the bottom of the second recess; and
   d) a fourth step of forming an opening extending through the first principal surface to the second principal surface by removing part of the whole of the second diaphragm region.

2. The method of manufacturing a semiconductor device, comprising:
   forming an element region on a first principal surface of a semiconductor substrate, the first step comprising:
   a step of forming a first semiconductor region of a second conductivity type on a semiconductor substrate of a first conductivity type;
   a step of forming a second semiconductor region of the first conductivity type in the first semiconductor region, the second semiconductor region extending from the surface of the first semiconductor region to the surface of the semiconductor substrate;
   a step of forming a third semiconductor region of the second conductivity type in the surface layer of the second semiconductor region, the third semiconductor region having an impurity concentration higher than the first semiconductor region and being in contact with the first semiconductor region;
   a step forming a first metal wiring layer on the first semiconductor region, the first metal wiring layer being electrically connected to the first semiconductor region; and
   a step of forming a second wiring layer on the second semiconductor region, the second wiring layer being electrically connected to the second semiconductor region;
   forming a first diaphragm region by forming a first recess in a second principal surface of the semiconductor substrate;
   forming a second diaphragm region by forming a second recess at the bottom of the first recess, the second diaphragm region being formed of the third semiconductor region at the bottom of the second recess; and
   forming an opening extending through the first principal surface to the second principal surface by removing part or the whole of the second diaphragm region.

3. The method of claim 2, wherein said second step comprises:
   a step of forming a first etching mask on the whole surface over the first to third semiconductor regions and the first and second wiring layers;
   a step of selectively forming a second etching mask on the second principal surface of the semiconductor substrate; and
   a step of electrolytically etching the semiconductor substrate by applying a bias current to the first and third semiconductor regions via the first wiring layer.

4. The method of claim 3, wherein said third step electrolytically etches the semiconductor substrate by applying a bias current to the first and third semiconductor regions via the first wiring layer, and stops the electrolytic etching at the interface between the second and third semiconductor regions.

5. The method of claim 4, wherein said fourth step comprises:
   a step of selectively removing the first etching mask at a region on the third semiconductor region; and
   a step of mechanically removing part or the whole of the third semiconductor region.

6. The method of claim 4, wherein said fourth step comprises:
   a step of selectively removing the first etching mask at a region on the third semiconductor region; and
   a step of removing part or the whole of the third semiconductor region by dry etching.

7. The method of claim 6, wherein said dry etching uses a plasma process.

8. The method of claim 6, wherein said dry etching uses a photo-excited process.

9. The method of claim 4, wherein said fourth step comprises:
   a step of selectively removing the first etching mask at a region on the third semiconductor region; and
   a step of removing part or the whole of the third semiconductor region by wet etching.

10. A method of manufacturing a semiconductor device, comprising:
    a) a first step of forming an element region on a first principal surface of a semiconductor substrate;
    b) a second step of forming a first and a second openings having the same pattern width at the first principal surface by forming recesses extending from a second principal surface to the first principal surface of the semiconductor substrate; and
    c) a third step of forming a third opening, enlarging the second opening, the third opening having different area from that of the first opening by processing and removing regions adjacent to the second openings.

11. The method of claim 10, wherein said second step includes a step of forming the second opening at regions corresponding to parts of sides of polygons inscribed to the third opening, and said third step is a step of removing the remaining parts of the sides unopened by said second step.

12. The method of claim 11, wherein said third step removes the remaining parts of the sides of polygons by a mechanical means.

13. The method of claim 12, wherein the second opening is patterned so that the remaining parts of the sides of polygons are positioned on a scribing lane, and the mechanical means removes the remaining parts of the sides on the scribing lane.

14. The method of claim 11, wherein said third step removes the remaining parts of the sides of polygons by dry etching.

15. The method of claim 14, wherein the dry etching is performed by a plasma process or a photo-excited process.

16. The method of claim 11, wherein said 3rd step removes the remaining parts of the sides of polygons by wet etching.

17. A method of manufacturing a semiconductor device, comprising:

a step of forming a first semiconductor region of a second conductivity type on a semiconductor substrate of a first conductivity type;

a step of forming a second semiconductor region of the first conductivity type in the first semiconductor region, the second semiconductor region extending from the surface of the first semiconductor region to the surface of the semiconductor substrate in the form of a first and a second patterns having the same pattern width; and a step of forming a first and a second patterns, corresponding to the first and second patterns, respectively, by selectively removing the second semiconductor region and part of the first conductivity type semiconductor substrate by electrolytic etching.

18. The method of claim 17, further comprising:

a step of, after selectively removing the second semiconductor region, removing the first semiconductor region adjacent to the second opening to form a third opening having larger area than that of the first opening.

19. The method of claim 18, wherein removing the first semiconductor region is performed by a mechanical means.

20. The method of claim 18, wherein removing the first semiconductor region is performed by dry etching or wet etching.

21. A method of manufacturing a semiconductor device, comprising:

a first step of forming an element region on a first principal surface of a semiconductor substrate, the element region having a part essentially consisting of an upper layer acting as an etch stop layer contacting with the upper layer, the upper layer being thinner than the lower layer;

a second step of forming terraced recesses, each recess having an offset at boundary between the semiconductor substrate and the element region in and at a second principal surface of the semiconductor substrate, the second step stops at a boundary between the upper and lower layer to have diaphragm regions formed of the upper layer at each bottom of the terraced recess; and a third step of forming penetrations extending from the second to first principal surface by removing part or whole of the diaphragm regions so as to provide apertures at the first principal surface, at least two of the apertures having different open areas each other.

22. The method of claim 21, wherein said third step comprises a step of mechanically removing said part or whole of the diaphragm regions.

23. A method of manufacturing a semiconductor device, comprising:

a first step of forming an epitaxial layer of second conductivity type on a top surface of a semiconductor substrate of a first conductivity type;

a second step of selectively forming diffused layers of the first conductivity type from a top surface of the epitaxial layer to reach the top surface of a semiconductor substrate;

a third step of forming etch stop layers of second conductivity type in and at top surfaces of the diffused layers respectively, the etch stop layers being thinner than the diffused layers;

a fourth step of forming terraced recesses, each recess having an offset at boundary between the semiconductor substrate and the epitaxial layer in and at a bottom surface of the semiconductor substrate, the fourth step stops at a boundary between the etch stop layer and diffused layer to leave diaphragm regions formed of the etch stop layers at each bottom of the terraced recess; and a fifth step of forming penetrations by removing part or whole of the diaphragm regions so as to provide apertures at the top surface, at least two of the apertures having different open areas each other.

24. The method of claim 23, wherein said fifth step comprises a step of mechanically removing said part or whole of the diaphragm regions.

* * * * *